US008841047B2

(12) United States Patent
Yu et al.

(10) Patent No.: US 8,841,047 B2
(45) Date of Patent: Sep. 23, 2014

(54) EXTREME ULTRAVIOLET LITHOGRAPHY PROCESS AND MASK

(75) Inventors: Shinn-Sheng Yu, Hsinchu (TW); Yen-Cheng Lu, New Taipei (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 13/437,099

(22) Filed: Apr. 2, 2012

(65) Prior Publication Data

US 2013/0260288 A1 Oct. 3, 2013

(51) Int. Cl.
*G03F 1/00* (2012.01)

(52) U.S. Cl.
USPC ................................................ 430/5; 430/311

(58) Field of Classification Search
USPC ...................................................... 430/5, 311
See application file for complete search history.

(56) References Cited

U.S. PATENT DOCUMENTS

| | | | | |
|---|---|---|---|---|
| 2004/0091789 | A1 * | 5/2004 | Han et al. | 430/5 |
| 2007/0154817 | A1 * | 7/2007 | Leunissen et al. | 430/5 |
| 2009/0263730 | A1 * | 10/2009 | Kim | 430/5 |

OTHER PUBLICATIONS

Pei-Yang Yan et al., “EUVL Alternating Phase Shift Mask,” Proc. of SPIE vol. 7969, pp. 79690G-1-G10, 2011.

Andrew B Kahng et al., “Automated Layout and Phase Assignment Techniques for Dark Field Alternating PSM,”SPIE vol. 3546, Part of the BACUS Symposium on Photomask Technology and Management, Redwood City, California, Sep. 1998, pp. 222-231.

Martin Lowisch et al., “Optics for EUV Production,”Proc of SPIE vol. 7636, 2010, 11 pages.

Alfred Kwok-Kit Wong, “Resolution Enhancement Techniques in Optical Lithography,”, SPIE Digital Library, Published by The International Society for Optical Engineering, 2001, Chapter 7-Selecting Appropriate RETs, SPIE Press (2001), 18 pages.

Alfred Kwok-Kit Wong, “Resolution Enhancement Techniques in Optical Lithography,”, SPIE Digital Library, Published by The International Society for Optical Engineering, 2001, Chapter 8—Second-Generation RETs, SPIE Press (2001), 11 pages.

Alfred Kwok-Kit Wong, “Resolution Enhancement Techniques in Optical Lithography,”, SPIE Digital Library, Published by The International Society for Optical Engineering, 2001, Bibliography, SPIE Press (2001), 26 pages.

Alfred Kwok-Kit Wong, “Resolution Enhancement Techniques in Optical Lithography,”, SPIE Digital Library, Published by The International Society for Optical Engineering, 2001, “Concluding Remarks”, SPIE Press (2001), 3 pages.

Alfred Kwok-Kit Wong, “Resolution Enhancement Techniques in Optical Lithography,”, SPIE Digital Library, Published by The International Society for Optical Engineering, 2001, Conversion Charts, SPIE Press (2001), 2 pages.

* cited by examiner

*Primary Examiner* — Stewart Fraser
(74) *Attorney, Agent, or Firm* — Haynes and Boone, LLP

(57) ABSTRACT

A process of an extreme ultraviolet lithography (EUVL) is disclosed. The process includes receiving an extreme ultraviolet (EUV) mask with multiple states. Different states of the EUV mask are assigned to adjacent polygons and a field. The EUV mask is exposed by a nearly on-axis illumination (ONI) with partial coherence σ less than 0.3 to produce diffracted lights and non-diffracted lights. Most of the non-diffracted lights are removed. The diffracted lights and the not removed non-diffracted lights are collected and directed to expose a target by a projection optics box.

20 Claims, 8 Drawing Sheets

153
152
151
140
130
105
230
210
230
210
230
220
210
220
230
210
230
110
150
120
200

EXTREME ULTRAVIOLET LITHOGRAPHY PROCESS AND MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, for AltPSM, one of the methods to generate a phase-shifting region without much attenuation in reflectivity is to create a step of appropriate height on a substrate and then form a multilayer (ML) over the step. However, the ML tends to smooth out the step height, leading to a large transition area between phase-shifting and non-phase-shifting regions. This will limit the achievable resolution limit. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
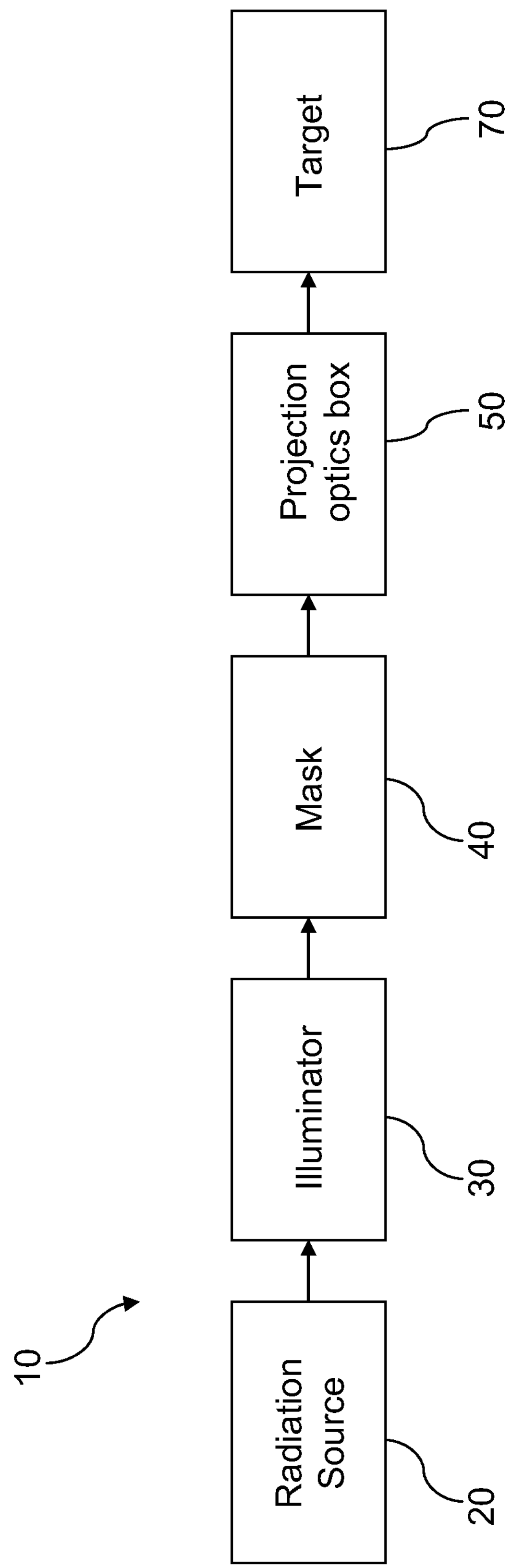
FIG. 1. is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present invention is disclosed. The EUV lithography process 10 employs an EUV radiation source 20 having a wavelength of about 1-100 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto the mask 40. In the EUV wavelength range, reflective optics is employed generally. Refractive optics, however, can also be realized by e.g., zoneplates. In the present embodiment, the illuminator 30 is set up to provide a on-axis illumination (ONI) to illuminate the mask 40. In ONI, all incoming light rays incident on the mask at the same angle of incidence (AOI), e.g., AOI=6°, as that of the chief ray. In real situation, there may be some angular spread of the incident light. For example, if a disk illumination (i.e., the shape of the illumination on the pupil plane being like a disk centered at the pupil center) of a small partial coherence a, e.g., σ=0.3, is employed, the maximum angular deviation from the chief ray is $\sin^{-1}[m\times\sigma\times NA]$, where m and NA are the magnification and numerical aperture, respectively, of the imaging system (i.e., the projection optics box (POB) 50 to be detailed below). Partial coherence σ can also be used to describe a point source which produces a plane wave illuminating the mask 40. In this case, the distance from the pupil center to the point source in the pupil plane is NA×σ and the AOI of the corresponding plane wave incident on the mask 40 is $\sin^{-1}$ [m×σ×NA]. In the present embodiment, it is sufficient to employ a nearly ONI consists of point sources with σ less than 0.3.

The EUV lithography process 10 also employs a mask 40 (in the present disclosure, the terms of mask, photomask, and reticle are used to refer to the same item). The mask 40 can be a transmissive mask or a reflective mask. In the present embodiment, the mask 40 is a reflective mask such as described in further detail below. The mask 40 may incorporate other resolution enhancement techniques such as phase-shifting mask (PSM) and/or optical proximity correction (OPC).

The EUV lithography process 10 also employs a POB 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation).

Figure 2:
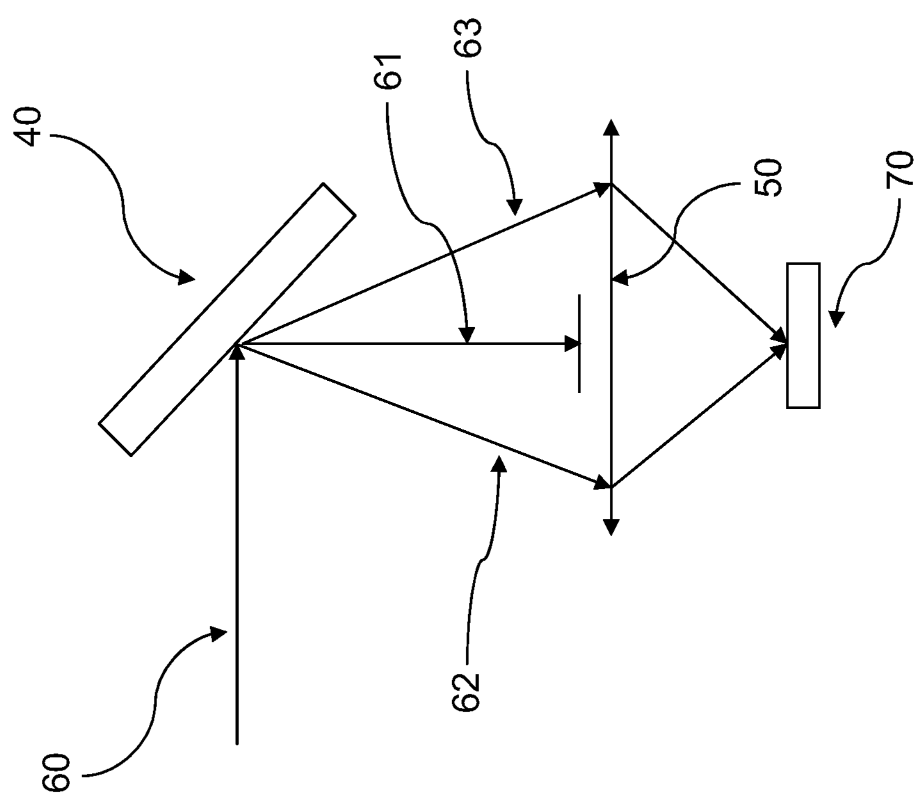
FIG. 2. is a diagrammatic perspective view of a projection optics box (POB) employed in the lithography process for implementing one or more embodiments of the present invention. Since a POB by reflective optics is difficult to sketch, the equivalent refractive optics is used to illustrate the underlying principle.

Referring to FIG. 2, an incident light ray 60, after being reflected from the mask 40, is diffracted into various diffraction orders due to presence of these mask patterns, such as a 0-th diffraction order ray 61, a −1-st diffraction order ray 62 and a +1-st diffraction order ray 63. For lithographic imaging, purely coherent illumination is generally not employed. Disk illumination with partial coherence σ being at most 0.3 generated by the illuminator 30 is employed. In the depicted embodiment, the non-diffracted light rays 61 are mostly (e.g., more than 70%) removed by, e.g., central obscuration in the pupil plane. The −1-st and +1-st diffraction order rays, 62 and 63, are collected by the POB 50 and directed to expose a target 70. Since the strength of the −1-st and +1-st diffraction order rays, 62 and 63, are well balanced, they interfere with each other and will generate a high contrast aerial image. Also, the −1-st and +1-st diffraction order rays, 62 and 63, are of the same distance from the pupil center in the pupil plane, and depth of focus (DOF) is maximized.

The target 70 includes a semiconductor wafer with a photosensitive layer (e.g., photoresist or resist), which is sensitive to the EUV radiation. The target 70 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity mask (BIM) and phase-shifting mask (PSM). An example BIM includes an almost totally absorptive region (also referring to as an opaque region) and a reflective region. In the opaque region, an absorber is present and an incident light beam is almost fully absorbed by the absorber. The absorber can be made of materials containing chromium, chromium oxide, chromium nitride, aluminum-copper, titanium, titanium nitride, tantalum, tantalum oxide, tantalum nitride, and tantalum boron nitride. In the reflective region, the absorber is removed and the incident light is reflected by a multilayer (ML), which will be described in further detail below. A PSM includes an absorptive region and a reflective region. A portion of the incident light reflects from the absorptive region with a proper phase difference with respect to a light reflected from the reflective region to enhance the resolution and imaging quality. The absorber of the PSM can be made by materials such as tantalum nitride and tantalum boron nitride at a specific thickness. The PSM can be attenuated PSM (AttPSM) or alternating PSM (AltPSM). An AttPSM usually has 2%-15% of reflectivity from its absorber, while an AltPSM usually has larger than 50% of reflectivity from its absorber.

Figure 3:
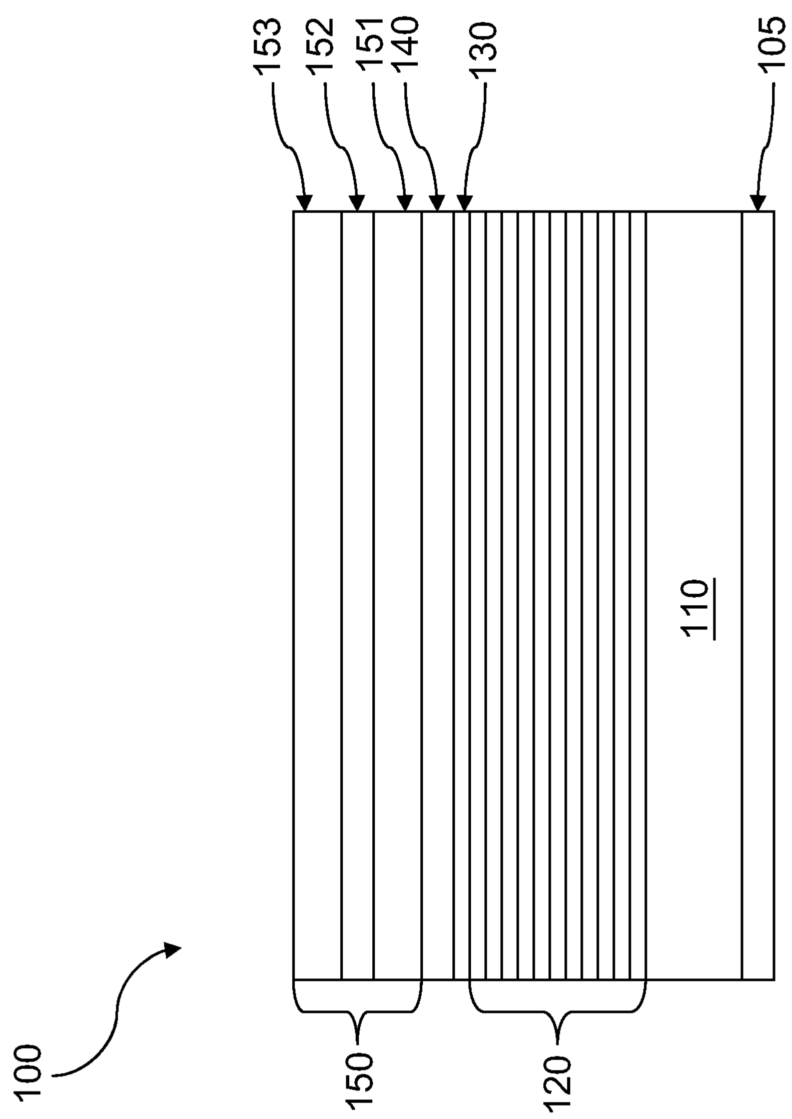
FIG. 3-5. are diagrammatic cross-sectional views of various aspects of one embodiment of an EUV mask at various stages of a lithography process constructed according to aspects of the present disclosure.

Referring to FIG. 3, a blank EUV mask 100 comprises a substrate 110 made of low thermal expansion material (LTEM). The LTEM material may include $TiO_2$ doped $SiO_2$, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be deposed under (as shown in the figure) the LTEM substrate 110 for the electrostatic chucking purpose. In an embodiment, the conductive layer 105 includes chromium nitride (CrN), though other compositions are possible.

A reflective multilayer (ML) 120 is deposed over the LTEM substrate 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type/wavelength. A typical number of film pairs is 20-80, however any number of film pairs is possible. In an embodiment, the ML 120 includes forty pairs of layers of Mo/Si. Each Mo/Si film pair has a thickness of about 7 nm, with a total thickness of 280 nm. In this case, a reflectivity of about 70% is achieved.

A capping layer 130 is formed above the ML 120 to prevent oxidation of the ML. In the present embodiment, the capping layer 130 includes silicon with about 4-7 nm thickness. A buffer layer 140 is formed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the ML 120. In the present embodiment, the buffer layer 140 includes chromium with about 2-5 nm thickness. In one embodiment, the capping layer and the buffer layer is a single layer.

In the present embodiment, an absorption stack 150 is formed above the buffer layer 140. The absorption stack 150 preferably absorbs radiation in the EUV wavelength range projected onto a patterned EUV mask 200. The absorption stack 150 includes multiple film layers from a group of chromium, chromium oxide, titanium nitride, tantalum nitride, tantalum, titanium, or aluminum-copper, palladium, tantalum nitride, aluminum oxide, molybdenum (Mo), or other suitable materials. With a proper configuration of multiple film layers, the absorption stack 150 will provide process flexibility in a subsequent etching process by different etch characteristics of each film. In one embodiment, the absorption stack 150 is formed by a first Mo layer 151/a first Cr layer 152/a second Mo layer 153, as shown in FIG. 3. In the depicted embodiment, the thickness of the first Cr layer 152 is about 3 nm. The thickness of the first Mo layer 151 is around 41 nm and the thickness of the second Mo layer 153 is around 44 nm.

One or more of the layers 105, 120, 130, 140 and 150 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 4:
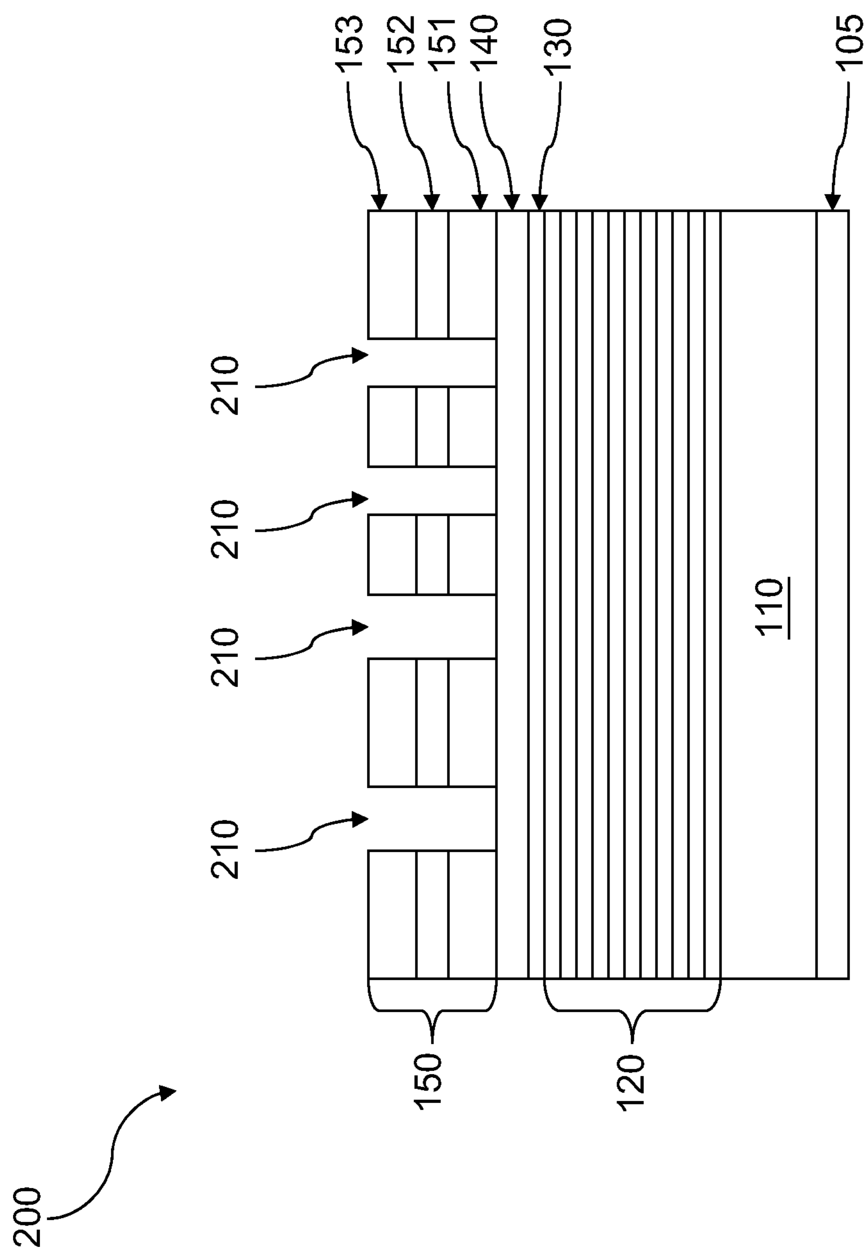

Referring to FIG. 4, in one of the present embodiments, the absorption stack 150 is patterned to form the design layout pattern EUV mask 200 with three states on the blank mask 100. The absorption stack 150 is patterned to form the state 210 first by patterning technique. A patterning process may include resist coating (e.g., spin-on coating), soft baking, mask aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing An etching process is followed to remove portions of the absorption stack 150 and form the first state 210. The etching process may include dry (plasma) etching, wet etching, and/or other etching methods. In the present embodiment, a multiple-step dry etching is implemented. The plasma etching starts to remove the second Mo layer 153 by fluorine-based gas, then proceeds to a second etching step to remove the first Cr layer 152 by chlorine-based gas, and then proceeds to a third etching step to remove the first Mo layer 151 by fluorine-based gas. Due to the nature of plasma fluorine-based gas and chlorine-based gas, the first and third etching steps have a substantially high etching selectivity with respect to Cr film and the second etching step has a substantially high etching selectivity with respect to Mo film. Thus during each etching step, the Mo and Cr layers can serve as adequate etching stop layers to each other to achieve a complete etching with a good process window.

Figure 5:
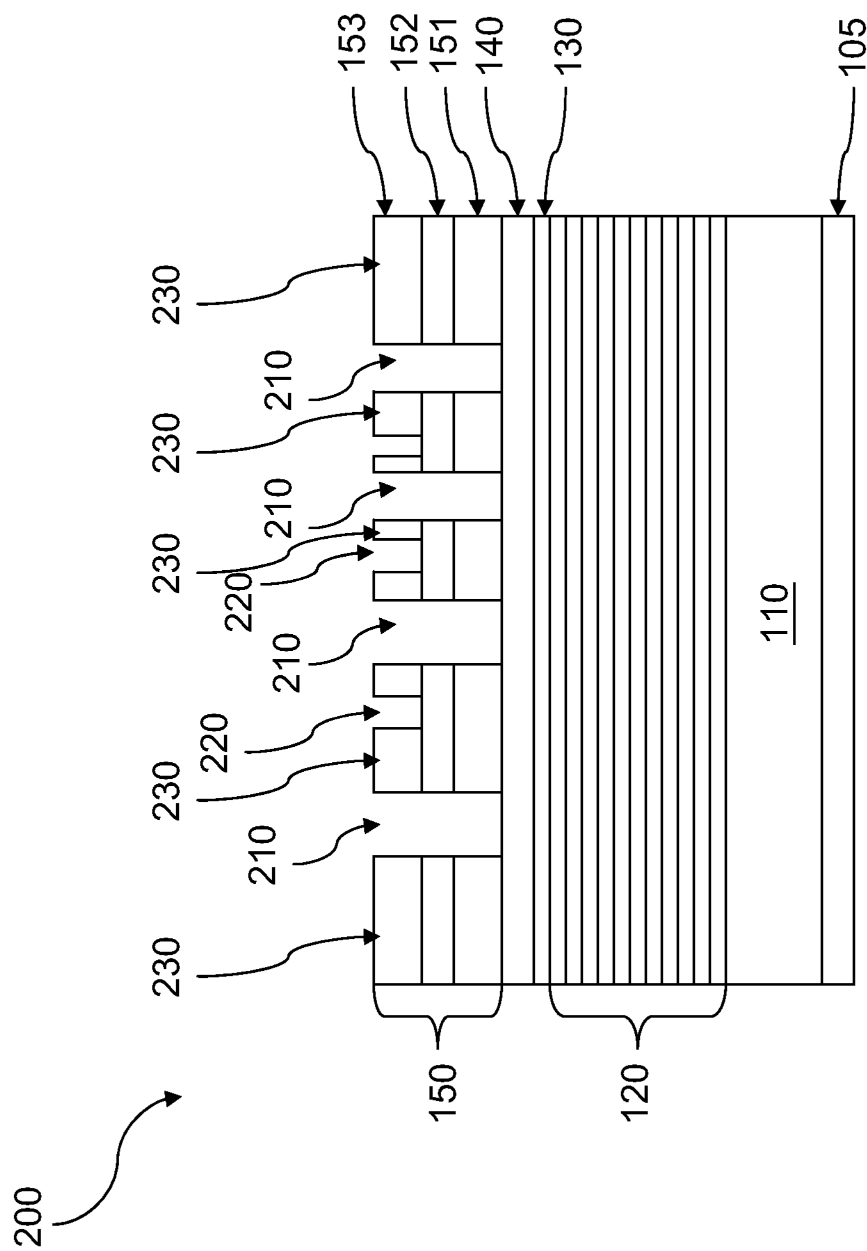

Referring to FIG. 5, a second state 220 on the EUV mask 200 is formed by other patterning and etching processes, similar in many respects to those discussed above in association with the formation of the first state 210 except only the second Mo layer 153 is removed in the etching process.

Figure 6:
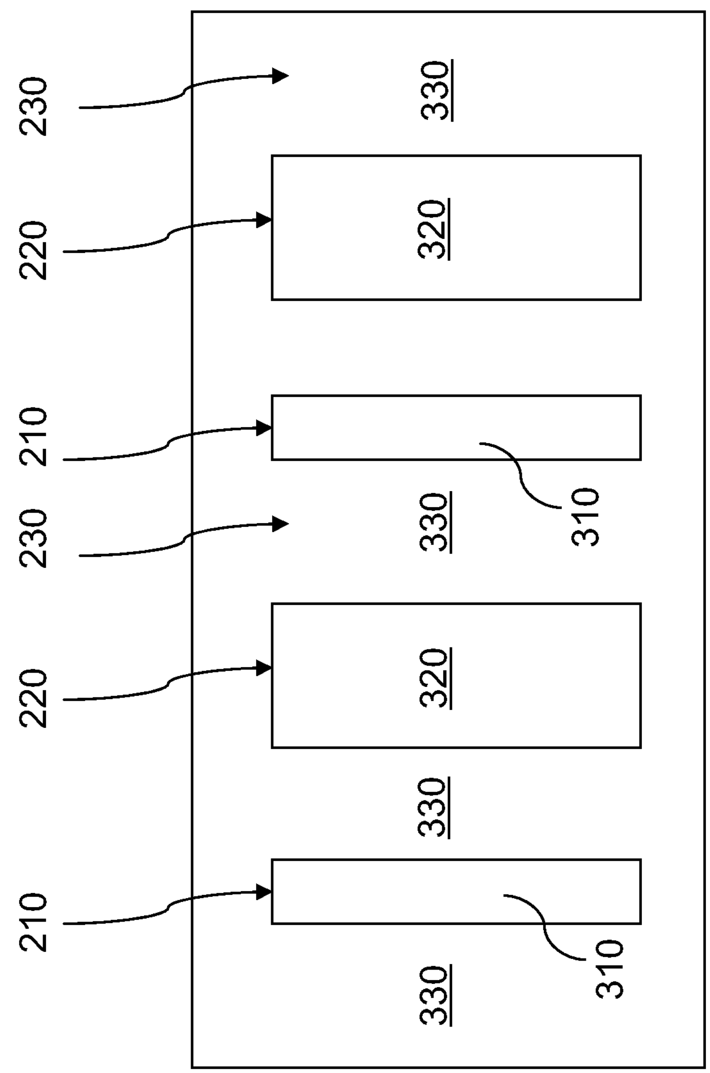
FIG. 6. is a diagrammatic perspective view of an EUV mask according to aspects of the present disclosure.

Still referring to FIG. 5, now the EUV mask 200 comprises three states, 210, 220 and 230. The reflection coefficients of state 210, state 220, and state 230 are r1, r2 and r3, respectively By a proper configuration of each layer of the absorption stack 150, such as film material and film thickness, three states can achieve prespecified values of the reflection coefficients. In one embodiment, the first state 210 is configured as (in order from top to bottom) the buffer layer 140/the capping layer 130/the ML 120/the LTEM substrate 110, the second state 220 is configured as 3-nm Cr/41-nm Mo/the buffer layer 140/the capping layer 130/the ML 120/the LTEM substrate 110, and the third state 230 is configured as 44-nm Mo/3-nm Cr/41-nm Mo/the buffer layer 140/the capping layer 130/the ML 120/the LTEM substrate 110. The three states are configured such that the absolute value of r1 is larger than the absolute value of r2 and the absolute value of r2 is larger than the absolute value of r3. The difference of the phases of the reflection coefficients of the state 210 and the state 220 is 180° (referred to as being out of phase). Meantime, the difference of the phases of the reflection coefficients of the state 210 and the state 230 is 360° (referred to as being in phase). The state 210 and state 220 of the EUV mask 200 are assigned to adjacent polygons 310 and 320. The state 230 is assigned to the field 330, which represents the background region on the mask without polygons), as shown in FIG. 6. (Note that the phase q of a complex number r is $\cos^{-1}[a/(a^2+b^2)^{0.5}]\times(180/\pi)$ if $b\geq 0$ and $-\cos^{-1}[a/(a^2+b^2)^{0.5}]\times(180/\pi)$ if $b<0$, where a and b are the real part and the imaginary part of the complex number r, respectively. Also, note that phase q is the same as phase $q\pm 360°\times i$, i being an integer.)

Figure 7:
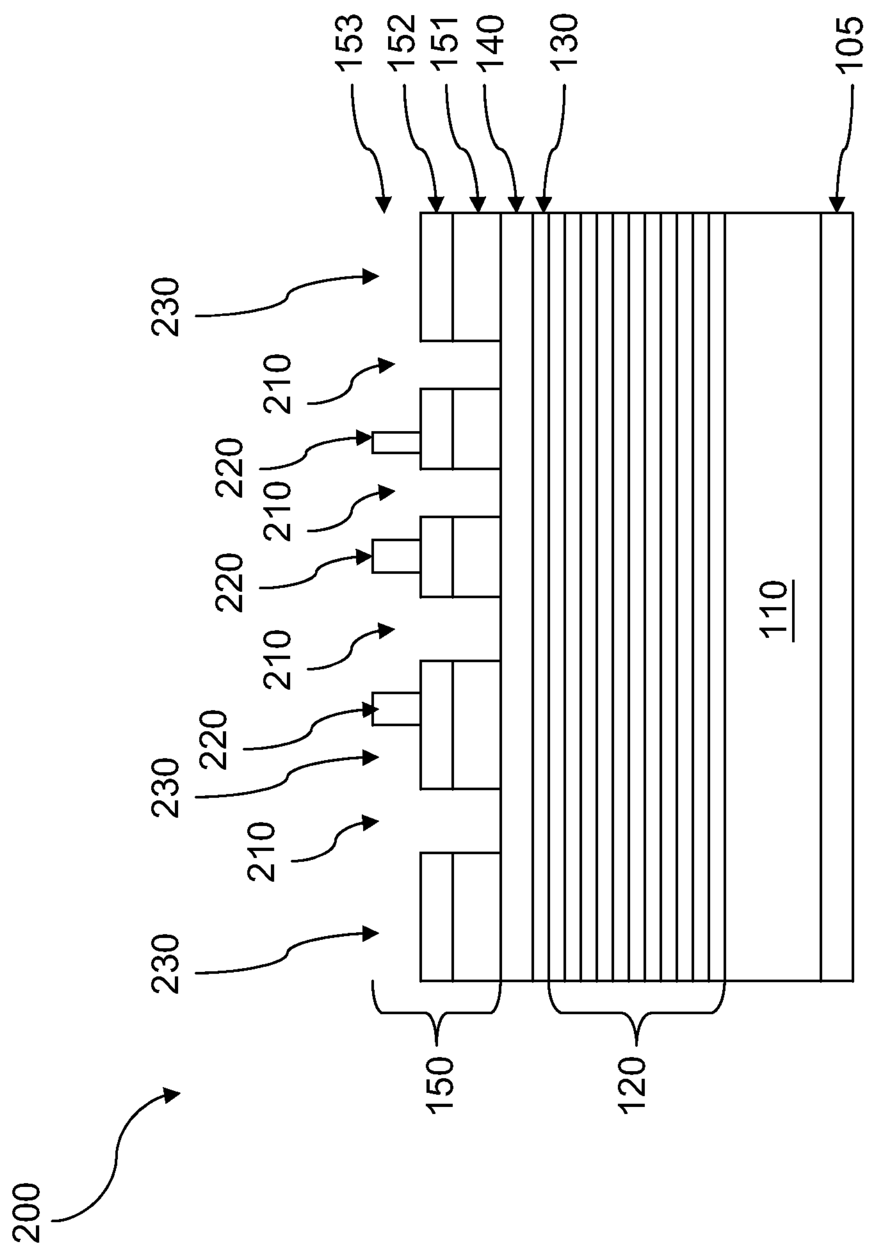
FIG. 7. is a diagrammatic cross-sectional views of various aspects of one embodiment of an EUV mask at various stages of a lithography process constructed according to aspects of the present disclosure FIG. 8. is a diagrammatic perspective view of another EUV mask according to aspects of the present disclosure.
Figure 8:
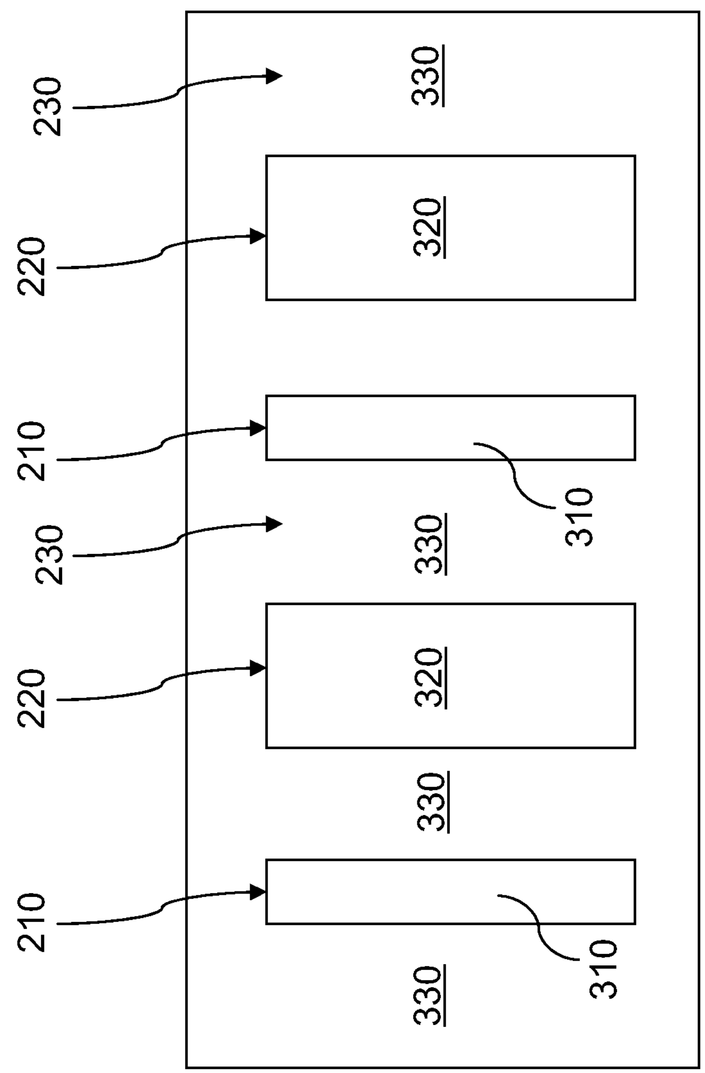

In another embodiment, three states 210, 220 and 230 are configured so that all three states are in phase. The difference of the phases of the reflection coefficients of any two states are less than 40°. As an example, the state 210 is configured as (in order from top to bottom) the buffer layer 140/the capping layer 130/the ML 120/the LTEM substrate 110, the state 220 is configured as 88-nm Mo/3-nm Cr/85-nm Mo/the buffer layer 140/the capping layer 130/the ML 120/the LTEM substrate 110, and the state 230 is configured as 3-nm Cr/85-nm Mo/the buffer layer 140/the capping layer 130/the ML 120/the LTEM substrate 110. The three states are configured such that the absolute value of r1 is larger than the absolute value of r3 and the absolute value of r3 is larger than the absolute value of r2. The state 210 and 220 are assigned to adjacent polygons, 310 and 320. The state 230 is assigned to the field 330, as shown in FIGS. 7 and 8.

The present disclosure is directed towards lithography systems and processes. In one embodiment, an extreme ultraviolet lithography (EUVL) process includes receiving an extreme ultraviolet (EUV) mask with multiple states, wherein different states of the EUV mask are assigned to adjacent polygons and a field (a region without polygons), exposing the EUV mask by a nearly on-axis illumination (ONI) with partial coherence σ less than 0.3 to produce diffracted lights and non-diffracted lights, removing most of the non-diffracted lights, collecting and directing the diffracted lights and the not removed non-diffracted lights by a projection optics box (POB) to expose a target.

In another embodiment, an EUVL process includes forming an EUV mask with three states, assigning different states of the EUV mask to adjacent polygons and a field, exposing the EUV mask by nearly an on-axis illumination (ONI) with partial coherence σ less than 0.3 to produce diffracted lights and non-diffracted lights, removing more than 70% of the non-diffracted lights, and collecting and directing the diffracted lights and the not removed non-diffracted lights by a projection optics box (POB) to expose a semiconductor wafer The present disclosure is also directed towards masks. In one embodiment, an EUV mask includes a low thermal expansion material (LTEM) substrate, a reflective multilayer (ML) above one surface of the LTEM substrate, and a conductive layer above an opposite surface of the LTEM substrate. A capping layer is provided above the reflective ML, a buffer layer is provided above the capping layer, and an absorption stack is provided above the buffer layer. The absorption stack comprises multiple layers. A multiple patterning process is performed on the absorption stack to form multiple states, which are assigned to different polygons and a field.

Based on the above, it can be seen that the present disclosure offers the EUV lithography process 10. The EUV lithography process 10 employs a nearly ONI, e.g., a disk illumination with partial coherence σ smaller than 0.3 to expose an EUV mask to produce diffracted lights and non-diffracted lights. The EUV lithography process 10 removes more than 70% of the non-diffracted lights and utilizes mainly the diffracted lights from two symmetrically located (on the pupil plane) and intensity balanced −1-st and +1-st diffraction orders to expose a semiconductor wafer. The EUV lithography process 10 also employs an EUV mask with three states with prespecified reflection coefficients. Different states are assigned to adjacent polygons and a field. The EUV lithography process 10 demonstrates an enhancement of aerial image contrast for both line/space and end-end patterns, and achieves a high depth of focus (DOF) in a large pitch range. The EUV lithography process 10 provides a resolution enhancement technique for future nodes.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) process for patterning a target, comprising:

providing an extreme ultraviolet (EUV) mask having an absorption stack disposed on a reflective multilayer (ML), wherein the absorption stack provides multiple reflective states including a first reflective state and a second reflective state, wherein the first reflective state is provided by an exposed top surface of a first absorption stack layer and the second reflective state is provided by an exposed top surface of a second absorption stack layer;

illuminating the EUV mask with an EUV light source providing an incident beam of a nearly on-axis illumination (ONI) with partial coherence σ less than 0.3;

reflecting the incident beam from the EUV mask thereby producing diffracted light and non-diffracted light using the multiple reflective states of the EUV mask;

removing a portion of the reflected, non-diffracted light; and collecting and directing the reflected, diffracted light and an unremoved portion of non-diffracted light with a projection optics box (POB) to expose the target.

2. The process of claim 1, wherein the EUV mask further comprises:

a low thermal expansion material (LTEM) substrate wherein the reflective ML is disposed above one surface of the LTEM substrate;

a conductive layer above an opposite surface of the LTEM substrate;

a capping layer above the reflective ML; and a buffer layer above the capping layer; and wherein the absorption stack is above the buffer layer.

3. The process of claim 2, wherein the capping layer and the buffer layer is a single material layer.

4. The process of claim 1, wherein the EUV mask provides three reflective states: the first reflective state of which the reflection coefficient is r1, the second reflective state of which the reflection coefficient is r2, and a third reflective state of which the reflection coefficient is r3.

5. The process of claim 1, wherein a third state reflective state of the EUV mask is provided by (from top to bottom) a buffer layer, a capping layer, the reflective ML, and the LTEM substrate.

6. The process of claim 1, wherein the second reflective state is provided by (from top to bottom) the first absorption stack layer, the second absorption stack layer, a third absorption stack layer, at least one of the buffer layer and the capping layer, the reflective ML, and the LTEM substrate, wherein the first absorption stack layer is a Cr layer, the second absorption stack layer is a Mo layer, and the third absorption stack layer is a Mo layer.

7. The process of claim 6, wherein the first reflective state is provided by (from top to bottom) the first absorption stack layer, the third absorption stack layer, at least one of the buffer layer and the capping layer, the reflective ML, and the LTEM substrate.

8. The process of claim 4, wherein the three states are configured as that an absolute value of r1 is larger than an absolute value of r2 and the absolute value of r2 is larger than an absolute value of r3.

9. The process of claim 4, wherein the three states are configured as that a difference of phases of r1 and r2 is in a range from 160° to 200°, a difference of phases of r2 and r3 is in a range from 160° to 200°, and a difference of phases of r3 and r1 is less than 40°.

10. The process of claim 7, wherein film thicknesses of the third absorption stack layer, the first absorption stack layer, and the second absorption stack layer are 41±3 nm, 3±1 nm, and 44±3 nm, respectively.

11. The process of claim 4, wherein the third reflective state is exhibited on a field of the EUV mask.

12. The process of claim 1, wherein more than 70% of the non-diffracted light is removed.

13. The process of claim 1, wherein collecting the diffracted light includes collecting light of −1-st and +1-st diffraction orders.

14. The process of claim 1, wherein directing the diffracted light includes directing light of −1-st and +1-st diffraction orders towards the target.

15. An extreme ultraviolet lithography (EUVL) process for patterning a semiconductor wafer, comprising:

patterning an extreme ultraviolet (EUV) mask that has an absorber layer with multiple material layers to provide multiple reflective states by removing portions of the multiple material layers of the absorber layer, wherein the removing portions provides for exposing a top surface of at least two different layers of the multiple material layers of the absorber layer thereby providing a first reflective state and a second reflective state;

delivering a radiation beam to the EUV mask using an EUV light source wherein the radiation beam has a nearly on-axis illumination (ONI) with partial coherence $\sigma$ less than 0.3;

reflecting the delivered radiation beam, wherein the EUV mask having multiple reflective states produces diffracted light and non-diffracted light;

removing a portion of the non-diffracted light, the portion comprising more than 70% of the non-diffracted light; and collecting and directing the diffracted light and an unremoved portion of the non-diffracted light by a projection optics box (POB) to expose the semiconductor wafer.

16. The process of claim 15, wherein the multiple reflective states includes three states that are configured so that an absolute value of r1 is larger than an absolute value of r3 and the absolute value of r3 is larger than an absolute value of r2.

17. The process of claim 16, wherein the three states are configured as that a difference of phases of r1 and r2 is less than 40°, a difference of phases of r2 and r3 is less than 40°, and a difference of phases of r3 and r1 is less than 40°.

18. The process of claim 15, wherein wherein the second state is configured as (from top to bottom) the multiple material layers including a 88±3 nm Mo layer, 3±1 nm Cr, and a 85±3 nm Mo layer of the absorber layer, a buffer layer, a capping layer, a reflective ML, and a LTEM substrate, and further wherein the first state is configured as (from top to bottom) a portion of the multiple material layers including a 3±1 nm Cr layer, the 85±3 nm Mo layer, the buffer layer, the capping layer, the reflective ML, and the LTEM substrate.

19. The process of claim 15, wherein the second states assigned to a polygon, while the first state is assigned to a field region of the semiconductor wafer.

20. A method for fabricating an extreme ultraviolet (EUV) lithography mask, the method comprising:

forming a multilayer structure over a mask substrate;

depositing a buffer layer over the multilayer structure;

depositing a first absorption stack layer over the buffer layer, a second absorption stack layer over the first absorption stack layer, and a third absorption stack layer over the second absorption stack layer;

patterning the first, second, and third absorption stack layers to provide a first reflective state at a top surface of the buffer layer; and patterning the third absorption stack layer to provide a second reflective state at a top surface of the second absorption stack layer, a third reflective state being provided by a top surface of the third absorption stack layer.

* * * * *